United States Patent [19]

Durney

[11] 4,015,764
[45] Apr. 5, 1977

[54] SOLID STATE CHIP INSERTION APPARATUS

[75] Inventor: David John Durney, Holland, Pa.

[73] Assignee: Burroughs Corporation, Detroit, Mich.

[22] Filed: May 30, 1975

[21] Appl. No.: 582,350

[52] U.S. Cl. .............................................. 227/118
[51] Int. Cl.² ........................................ B27F 7/08
[58] Field of Search ................. 227/18, 85, 86, 87, 227/88, 89, 90, 115, 118; 269/63, 67, 69

[56] References Cited

UNITED STATES PATENTS

| | | | |
|---|---|---|---|
| 792,017 | 6/1905 | Fraser | 227/115 X |
| 2,902,689 | 9/1959 | Petersen | 227/89 |
| 2,928,093 | 3/1960 | Bergsland et al. | 227/90 |
| 3,069,688 | 12/1962 | Heil | 227/18 |
| 3,209,623 | 10/1965 | Schardt | 269/69 |
| 3,442,430 | 5/1969 | Ackerman et al. | 227/90 |

*Primary Examiner*—Granville Y. Custer, Jr.
*Attorney, Agent, or Firm*—Carl Fissell, Jr.; Edward J. Feeney, Jr.; Kevin R. Peterson

[57] ABSTRACT

The present invention relates to semi-automatic apparatus for aligning and inserting a solid state electrical circuit chip or solid state chip receiving socket assembly into a printed circuit board or panel and automatically clinching a portion of the leads thereof so as to retain the chip and/or socket against accidental dislodgement from the circuit board prior to dip or wave soldering of the board.

10 Claims, 17 Drawing Figures

SOLID STATE CHIP INSERTION APPARATUS

BACKGROUND OF THE INVENTION

Modern dataprocessing apparatus including calculating devices, bookkeeping and record generating or handling equipment have been and are presently being reduced in overall size so as to afford economy and ease of operation as well as greater flexibility and portability of handling. This revolution in size reduction has been accomplished for the most part by the introduction and extensive utilization of the so-called dual-in-line package (DIP) for housing integrated solid state electronic circuits of every type, kind and description including oscillators, amplifiers, memories, operational amplifiers, etc.

The extensive use of the DIP device for housing integrated circuits has generated a proliferation of fully automatic machinery for the purpose of inserting these packages into printed circuit boards to provide composite modular sub-assemblies such as memories, etc. The automatic machines typically have means for indexing the printed circuit board under the insertion head. The control of the indexing means is typically programmable. While this aforementioned fully automatic machinery is obviously desirable, it requires a substantial capital investment and also requires special skills to program and maintain.

The present disclosure describes a semiautomatic apparatus which overcomes the above disadvantages of a fully automatic machine and which provides an attractive alternative where lost cost, portability, ease and flexibility of operation, and minimum maintenance are important considerations.

The present semi-automatic insertion apparatus provides a tool to aid in the insertion of either DIP integrated sockets or DIP integrated solid state circuits. Accordingly, the tool enables the operator to increase the rate of assembly by a significant factor when compared to a manual operation.

SUMMARY OF THE INVENTION

The present invention as described herein comprises a number of mechanical subassemblies mechanically integrated, inter-related and connected so as to operate in a smooth progression of steps while requiring a minimum of physical human handling of parts. The apparatus includes an insertion head for inserting a solid state multi-function chip into a printed wiring assembly. Feeding means for feeding the solid state chips to the insertion head can comprise either a magazine feed or vibratory type feed. A carrier assembly is provided to hold printed circuit boards movable on an air bearing to provide the operator with means for positioning the carrier on an almost frictionless surface. As part of the carrier assembly a detent type template is provided which enables the operator to index the printed circuit board automatically, accurately, to locations desired for insertion of the solid state chip or socket. A clinch mechanism operating upon the leads of the printed wiring DIP chip bends several or all of them to the proper angle so as to secure the component prior to soldering which may be of the wave or dip type. A foot actuated solenoid type mechanism inserts the DIP IC or DIP socket into the desired location onto the board on command from the operator and thereafter automatically cycles to present the next chip for insertion while the operator moves or indexes the printed wiring assembly carrier to the next location. The hand operations are few, the controls are extremely accurate, there is no danger of misinsertion since the indexing is provided by means of detent mechanisms which are pin-cam-fed or moved and the socket assembly is arranged so that only the outer four leads are clinched or bent prior to soldering. Thus, should any problem arise with respect to the location of the chip prior to the soldering operation, the suspect chip may be removed quickly, simply and easily.

PREFERRED EMBODIMENT OF THE INVENTION

The present invention relates to apparatus for inserting and/or clinching a solid state chip or dual-in-line (DIP) package or a chip receiving receptacle in a printed circuit board accurately, simply, and effectively, without damage to the board or the chip pins and with minimal operating handling.

The apparatus embodying the present invention can be made easily transportable so that unlike the relatively ponderous and complex automatic machines for chip insertion it can be moved from place to place at will permitting easy set up and operation with relatively little operator intervention or handling.

Figure 1:
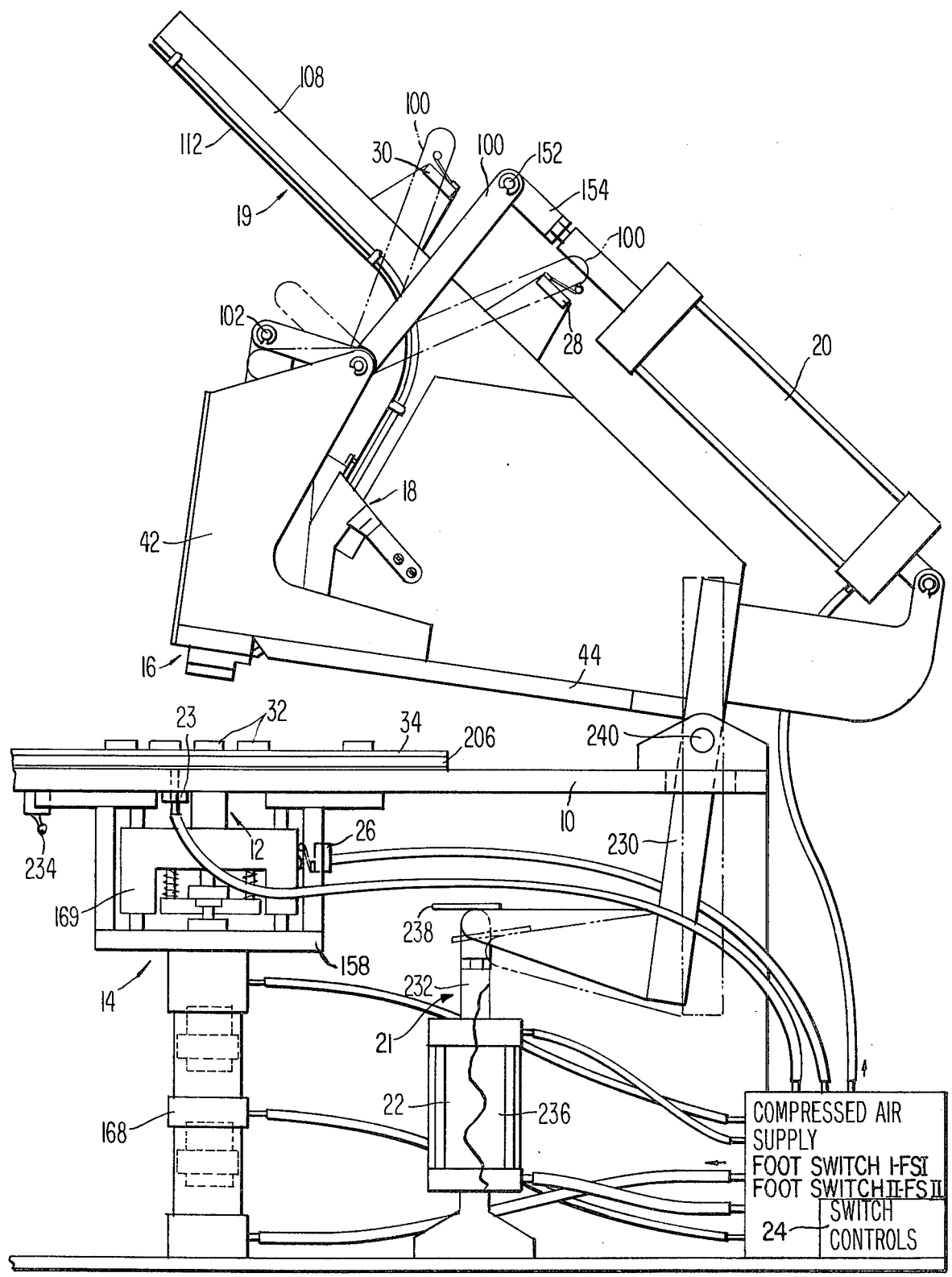
FIG. 1 is a side elevational view of the apparatus embodying the present invention illustrating the front compound air cylinder and the two rear air cylinders.

Referring first to FIG. 1 of the drawings, it is noted that the preferred embodiment of the present invention comprises a rigid, flat, relatively smooth, supporting bed or table 10, an anvil lead clinching mechanism 12, automatic anvil elevating apparatus 14, chip insertion head apparatus 16, solid state chip feed mechanism 18, chip magazine 19, hydraulic actuating apparatus 20 for the head, hydraulic heat tilting mechanism 21 (including two hydraulic cylinders), air bearing orifice 23, switch controls 24 including two foot pedal switches FSI and FSII, and three limit switches 26, 28 and 30, the latter providing means for controlling the application of compressed air for operation of the insertion apparatus as will be more fully described hereinafter.

Figure 2:
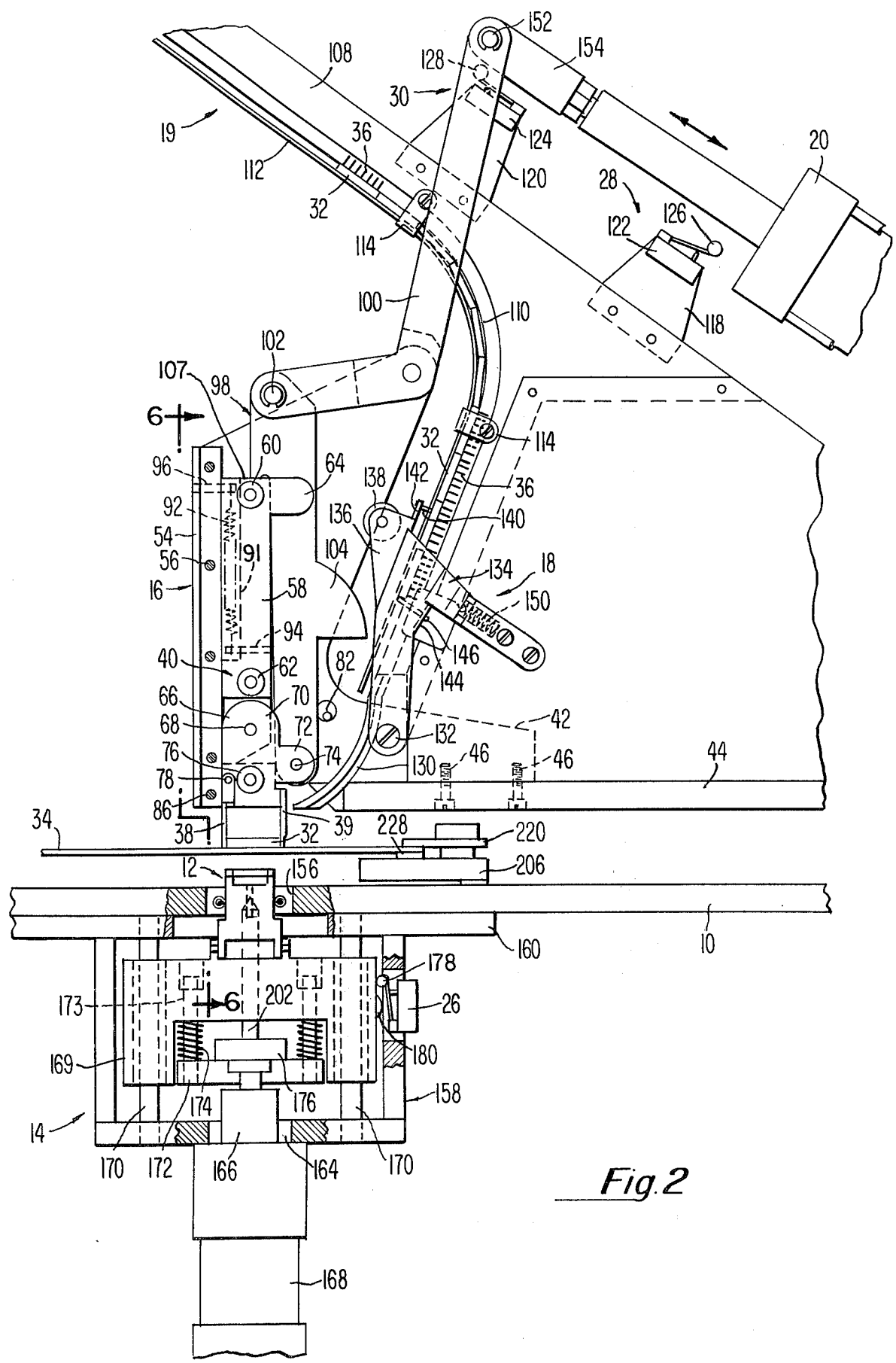
FIG. 2 is a sectional side elevational view illustrating the details of the elevating mechanism.

With reference to the enlarged detail sectional view of FIG. 2 illustrating the apparatus embodying the present invention in an operative position, it is seen a chip 32 is inserted into a printed circuit board 34 with the connecting pins or lugs 36 extending below the board adjacent to the anvil mechanism 12 in readiness for clinching prior to dip soldering.

The insertion head mechanism 16 comprises oppositely disposed jaw members 38 and 39 secured to the lower end of a two part vertically movable slide mechanism 40, as will be described later on herein.

Figure 3:
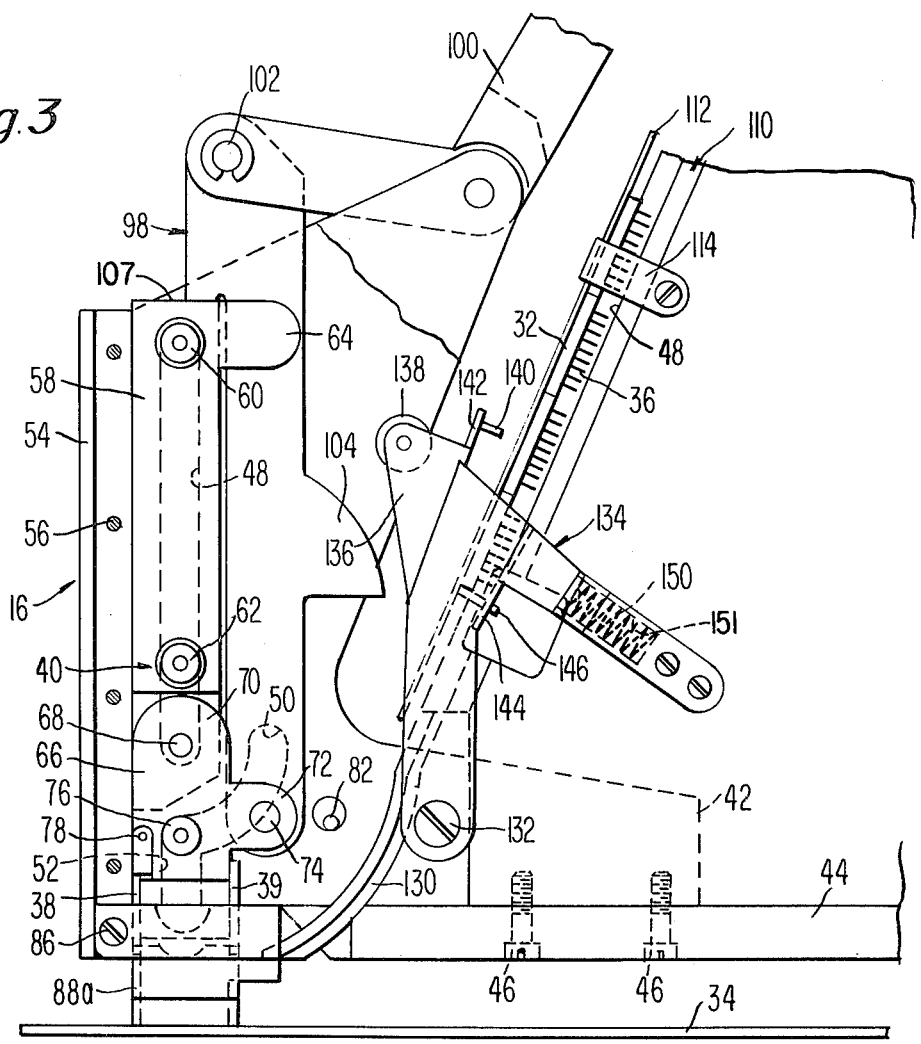
FIG. 3 is an enlarged detail view of a portion of the insertion head of the present invention.
Figure 6:
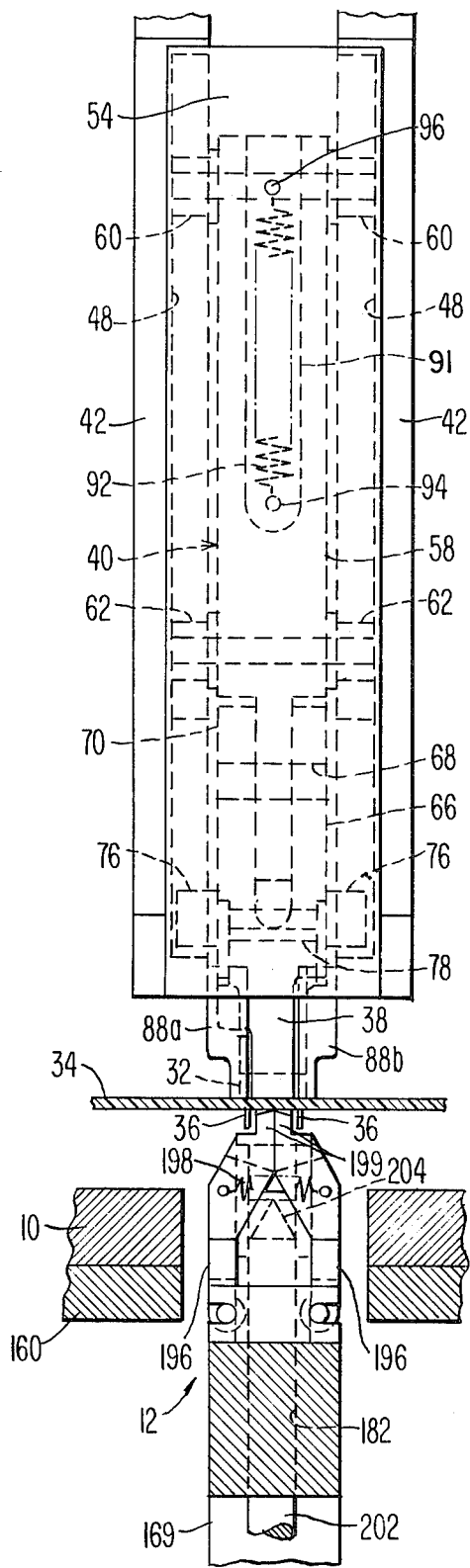
FIG. 6 is a view along the line 6—6 of FIG. 2.

Oppositely disposed, irregularly shaped support-guide members 42—42, FIG. 6, are arranged to project vertically upward away from a base supporting member 44 to which members 42—42 are secured as by bolts 46. As seen in FIG. 3, the confronting (facing) flat surfaces of members 42—42 (only one of which is shown) are each provided with a pair of grooves; a vertical groove 48 and substantially arcuately shaped groove 50. The lower portion 52 of groove 50 is substantially straight for purposes to be explained shortly. The forward edges of members 42—42 (leftwardly as viewed in FIGS. 2, 3 and 4) are secured together by means of a vertical coupling or retaining member 54 to which they are attached by bolts 56.

Vertically disposed between the guide members 42—42 is a rigid, elongated push rod 58 (FIG. 2) carrying upper and lower pairs of oppositely disposed cam guide rollers 60 and 62, respectively, receivable in grooves 48. The upper end of rod 58 is U-shaped to provide a yoke as at 64 which is employed as a guide for associated mechanism as will be described shortly. The lower end of rod 58 is mounted to the chip insertion head 16. Head 16 comprises an irregularly shaped DIP chip engaging member 66. The upper rounded portion 70 of member 66 is yoked to the lower end of rod 58 by means of pivot pin 68 enabling member 66 to swing arcuately (counter clockwise in FIGS. 2, 3 and 4) about the pivot pin 68 when the machine is in operation. The rightwardly extending protuberance 72 also provides a yoke about pivot pin 74 for associated apparatus to be described shortly. A pair of oppositely disposed cam guide rollers 76 are secured to member 66 for movement within grooves 50 and 52 as hereinafter described.

Chip engaging members or blades 38 and 39 are attached to opposite sides of the depending end of member 66. Blade 39 is fixedly mounted thereto while blade 38 is pivotally hinged by means of pin 78 so as to permit the base to swing clockwise thereabout as the member 66 is moved against the tension of biasing spring 80, FIG. 4. A pin 82, FIGS. 2, 3 and 4A, projecting outwardly into the path of movement of blade 38 causes the blade to swing downwardly clockwise about pivot pin 78, for purposes to be described later on herein.

Figure 3A:
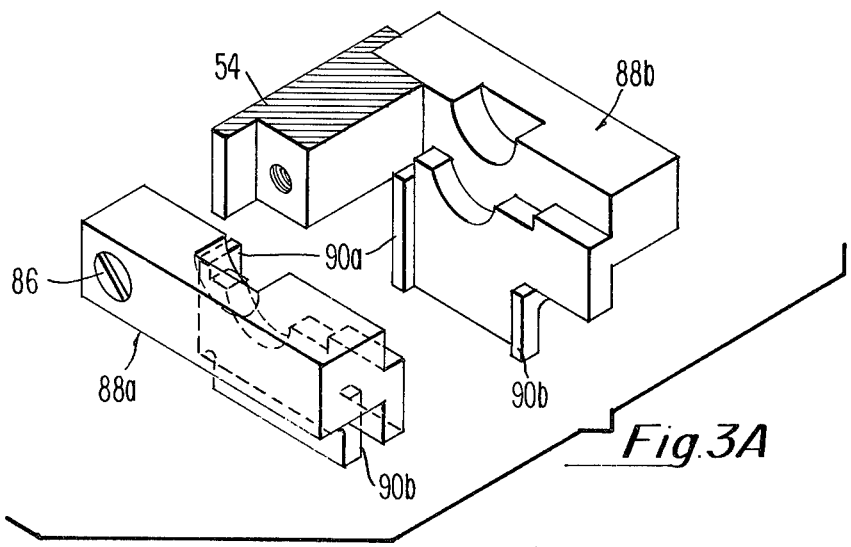
FIG. 3A is a greatly enlarged detail isometric view of the insertion head guide of the present invention.

Secured to the extreme lower end of member 54 by bolts 86 are oppositely disposed rigid guide members 88a and 88b as seen in FIG. 3A. Chip carrying members 38 and 39 are adapted to pass vertically upwardly and downwardly between members 88a and 88b riding against the opposed paired guide rails 90a and 90b as the apparatus is cycled.

An elongated tension spring 92 is located within the upper groove or channel 91, FIG. 2. One end of spring 92 is secured to a pin 94 on member 58 while the opposite end thereof is attached to a pin 96 located on the front cover attachment member 54. Spring 92 biases the members 58 and 66 vertically upwardly.

A reciprocably movable drive member 98 is pivoted at its lower end to the pivot pin 74 of member 66. The upper end of member 98 passes between the oppositely disposed guide members 64 and is pivotally attached to the L-shaped single piece actuator drive link 100 by means of pivot pin 102. A cam projection 104, for purposes to be explained presently, projects rightwardly, FIGS. 2, 3 and 4, from member 98. Under-cut area 106, FIG. 4, on member 98 is adapted to abut the top edge 107 of member 58 as will be described shortly.

The present invention includes means for automatically feeding DIP solid state chip members 32 from a supply of such chips to the insertion head mechanism as previously descried without operator intervention except for loading.

Figure 4:
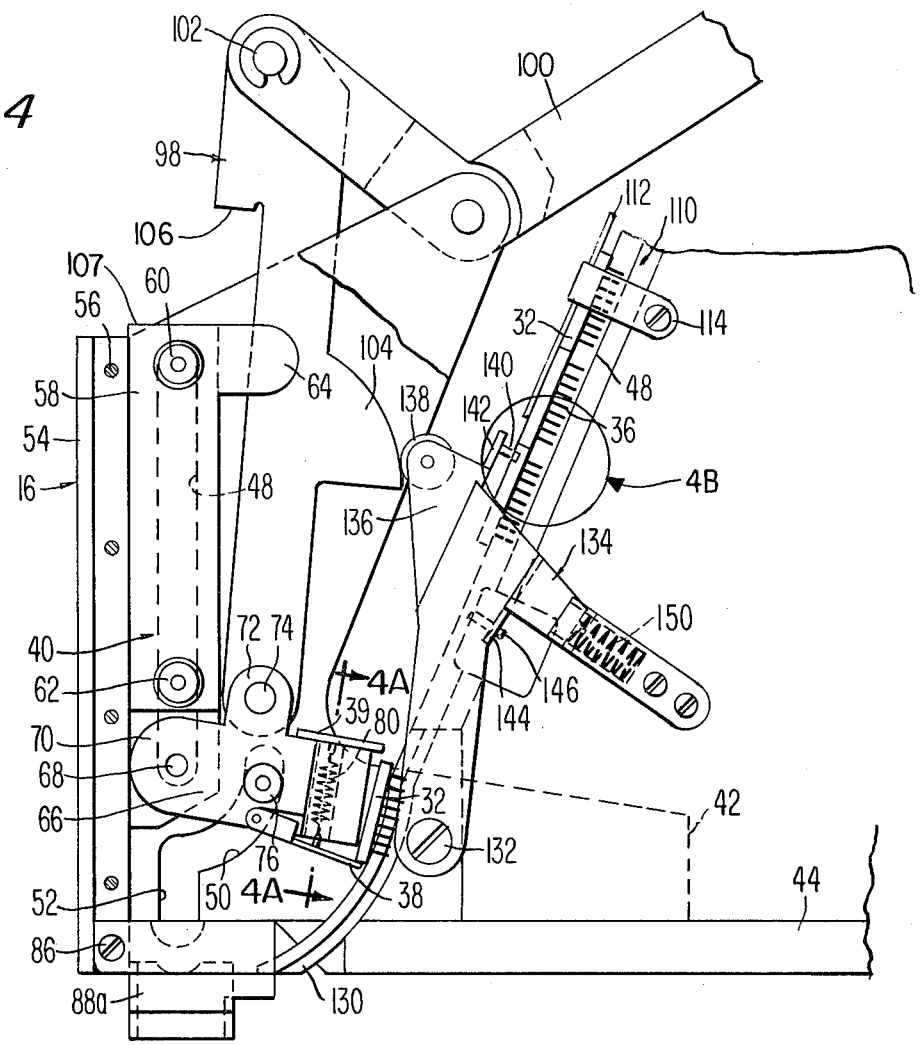
FIG. 4 is a view similar to FIG. 3 but with the parts moved to a different operative position.
Figure 4B:
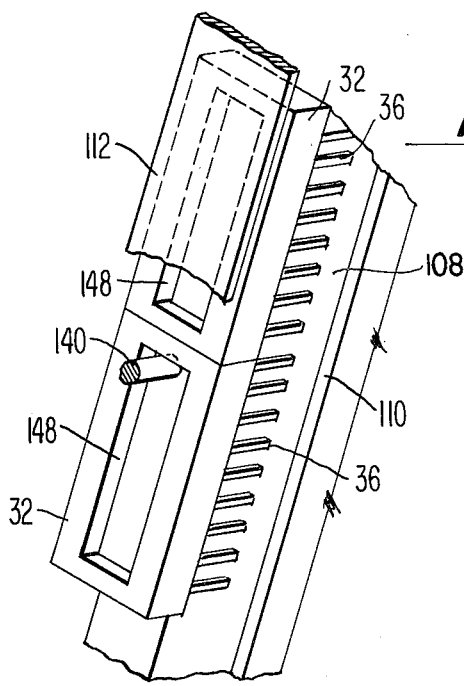
FIG. 4B is an enlarged isometric detail view of the portion circled at 4B in FIG. 4.
Figure 4A:
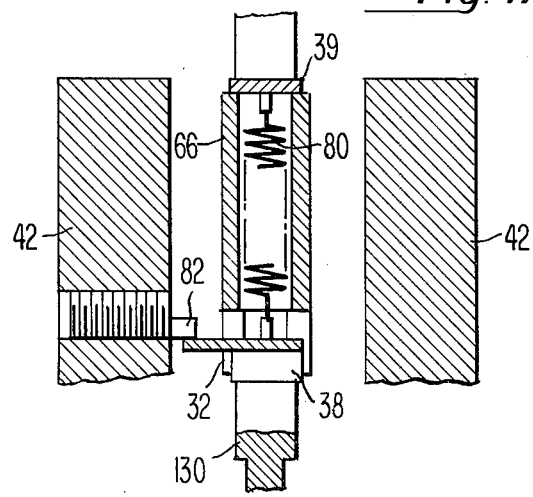
FIG. 4A is an enlarged sectional view along the line 4A—4A of FIG. 4.

As seen in the side elevational views of FIGS. 2, 3 and 4, an enlongated extension member 108 projects angularly upwardly from the machine base (leftwardly in the aforementined figures). The lower edge of member 108 is undercut on both sides as seen in FIG. 4B so as to provide a rail member 110. A rigid member or band 112 is secured adjacent to rail member 110 by means of angle brackets 114 strategically located along the member 108 so as to support the band away from the rail a slight, but adjustable distance, whereby DIP chips 32 can be loaded upside down therebetween with the connector pins 36 of each chip projecting vertically upwardly so as to straddle the undercut portion of member 110.

Also secured to the member 110 are two switch mounting blocks 118 and 120 each carrying a momentary contact switch 122 and 124 having a respective roller actuator 126 and 128 arranged above the body of the switch so as to contact other associated equipment for purposes to be explained presently.

The lower portion of support member 108 is angled downwardly and inwardly towards the chip insertion head 16. At the lower extremity thereof member 108 carries a separable channel member 130 shaped similarly to the member 110 and arcuately angled in such a manner as to bring the chip from the vertical "upside down" position to a horizonal "rightside-up" position by means of the chip engaging members of insertion head 16 as will be described in detail later on herein.

Operably associated with the member 108 and pivotally attached to the side frame of the apparatus by bolt 132 is a rockably movable, substantially A-shaped chip feeder-actuator 134 carrying in its upwardly, arcuately movable, leftwardly projecting apex 136 a roller 138 operably engageable with cam member 104 during each cycle of operation of the mechanism.

Adjacent roller 138 at the upper end of the A-frame 134 is a projecting pin member 140 carried on the end of a flat extension 142 while at the interior apex of the A-frame member, carried by a bent over flat portion 144 of the movable A-frame, is located a second pin member 146. The two pins project in opposite directions and are disposed in such a manner that lower pin 146 provides a bottom rest for the DIP-chip as it moves down the channel member 110, while upper pin 140 acts as a restraining means and is adapted to project into a recess area 148 at the back of the chip as shown most clearly in FIG. 4B of the drawings. A spring 150 in a recess 151 in the rightwardly extending leg of the A-frame member 134 biases the A-frame leftwardly as viewed in FIGS. 2, 3 and 4 so as to bring roller 138 into positive engagement with cam 104 as the cam is elevated during each cycle of operation of the apparatus. In this fashion, as will be explained in greater detail later on, a single chip 32 is supported by pin 146 so as to be automatically dispensed down the channel as cam 104 rocks frame 134 during each insertion operation.

The L-shaped link 100 pivoted to the drive link 98 at pivot point 102 comprises a yoke-like member having its oppositely, upwardly extending arms straddling member 108 and is attached at the upper extremities thereof to pivot point 152 on the forwardly (leftwardly in FIG. 2) extending adjustable plunger 154 of hydraulic ram 20. Forward movement of plunger 154 brings the lower edge thereof into contact with the roller 128 of control switch 124 closing the latter. Rearward movement of plunger 154 causes the lower edge of the plunger to contact roller 126 closing control switch 122. The purposes and operation of these switches will be described later on herein.

The present invention includes means for automatically clinching the opposite four contact leads of each DIP-chip once the chip is inserted within a printed circuit board. The apparatus for clinching the chips is illustrated in one or more of the FIGS. 1, 2, 5 and 6 through 9 inclusive, as will now be described.

Figure 5:
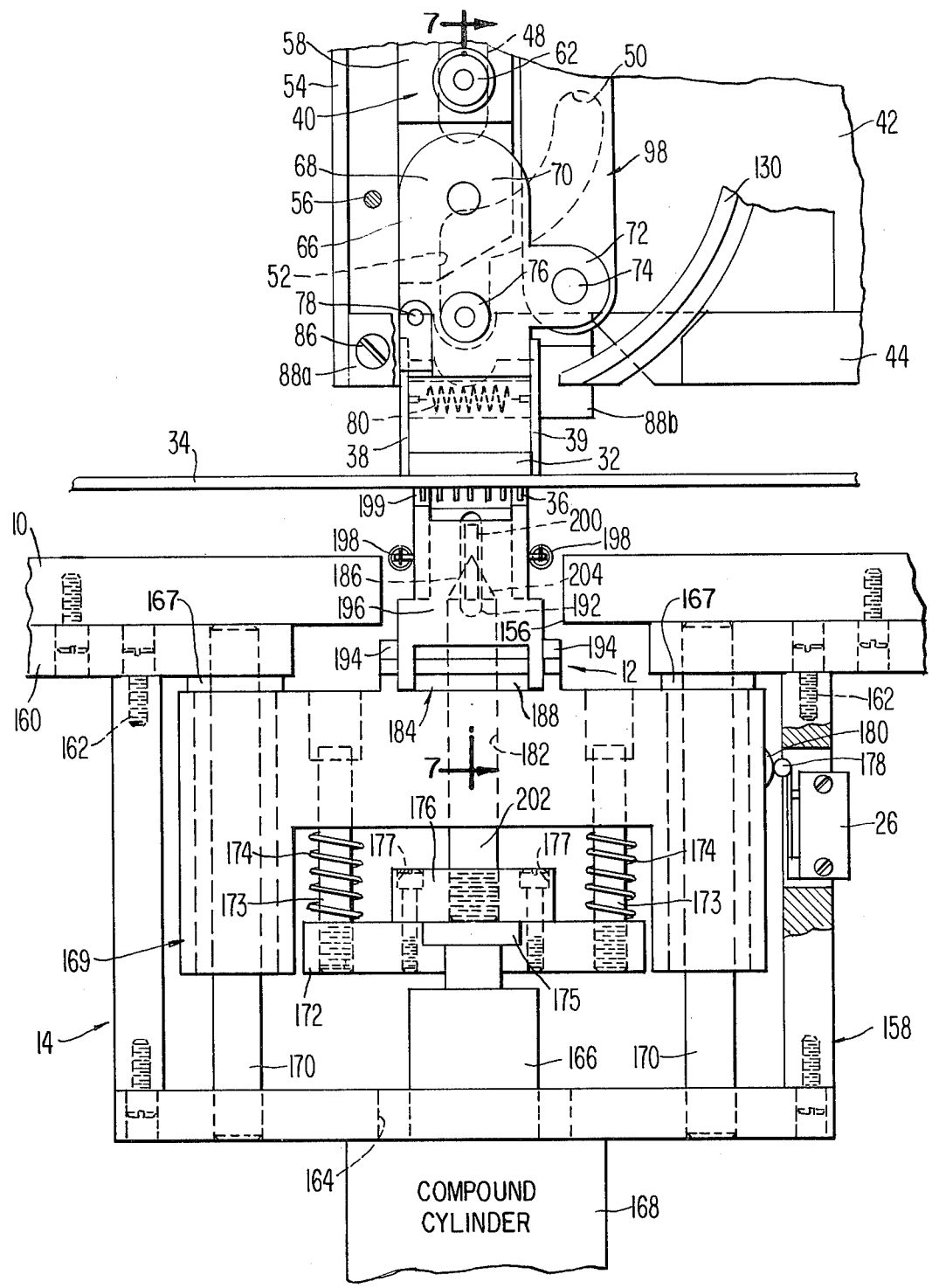
FIG. 5 is a front elevational view partially in section of the apparatus of the present invention.

Disposed beneath base plate 10, FIG. 5 so as to permit the active portions thereof to project upwardly through an aperture 156 therein is a rectangular boxlike assembly 158, FIG. 5. Assembly 158 is secured to sub-frame 160 as by bolts 162 (sub-frame 160 likewise being bolted to base 10). An opening 164 in the bottom of enclosure member 158 permits plunger 166 of compound hydraulic piston 168 to project therethrough. Compound piston 168 enables the apparatus to partake of a two step motion in the vertical direction, as will be described presently.

Elevating apparatus 14 includes an inverted C-shaped frame 169 slidable along opposite, vertically disposed posts 170 extending between the base 10 and the base of enclosure member 158. The chip contact or lead clinching anvil 12 is pivotally secured to the top of member 169 for vertical movement upwardly and downwardly therewith, as will be described later on. A flat horizontal member 172 is nested in the hollow of the inverted C-shaped member 169. Oppositely disposed vertical rods 173—173 are threaded at the lower ends into member 172 and carrying springs 174—174 which surround the rods. The upper ends of rods 173—173 extend through member 169 and are slideably receivable within coaxial recesses opening outwardly from the upper portion of member 169 permitting the rods a slight overtravel as they are moved upwardly as the mechanism is actuated. A collar 165 on the end of plunger 166 is fixed to member 172 and abuts a block 176 attached to member 172 by bolts 177 so that vertical motion of plunger 166 moves member 169 and member 172 upwardly against the tension of springs 174. As the ram member 166 is moved vertically upwardly, member 175 abutting member 176 moves member 172 upwardly. This latter motion compresses springs 174—174 forcing the C-shaped member 169, upwardly and concurrently, moving member 169 to bring the top surface of member 169 into abutting relationship with two Teflon washers 167—167 secured over shafts 170—170 between the top surface of member 169 and the bottom surface of member 160 as seen most clearly in FIG. 5. This brings the mechanism 12 against the bottom of the printed circuit board as seen most clearly in FIG. 5. This position is the end position of the first stage of movement of cylinder 168.

The hydraulic two-stage cylinder 168 enables the inserter apparatus to function smoothly and easily without interruption between operating strokes or cycles. Microswitch 26 located on the wall of the enclosure 158 has its operating element 178 biased toward a cam protuberance 180 on the member 169. Movement of member 169 causes switch 26 to be alternately closed and opened during each cycle of operation of the apparatus.

The multi-part chip lead clinching mechanism of the present invention is illustrated in detail in FIGS. 6 through 9 inclusive, as will now be described. Member 169 is provided with an elongated vertical aperture 182 therein extending into and through an integral raised crown portion 184 and terminating in a conical area 186 for purposes to be described presently. As seen in the exploded view of FIG. 9, the crown portion 184 is extremely configured to provide a vertical upstanding projecting portion 188, the opposite sides of which, are milled or machined to produce vertically, inwardly slanting edges 190. A slot 192 opens through member 188 into the interior thereof. Pivotally secured to opposite slotted supports 194 are confronting jaw members 196 biased together by springs 198 attached at opposite ends to pins 197. Each jaw member 196 carries vertically projecting oppositely disposed clinching elements 199—199. Projecting inwardly from each jaw member and integral therewith is a triangularly shaped member 200—200 receivable in opposite sides of slot 192 in abutting relationship as seen most clearly in FIGS. 6 and 7. A vertically extending actuator member 202 threadedly secured to the block 176 at the upper end of the compound hydraulic ram 168 is provided with a conical end portion 204 receivable in the conical area 186. Vertical movement of ram 166 causes actuator 202 to move the conical end 204 from the position of FIG. 6 to that of FIG. 8, forcing jaws 196—196 apart for purposes to be described shortly herein. This position is the end position of the first stage of movement of cylinder 168.

Figure 10:
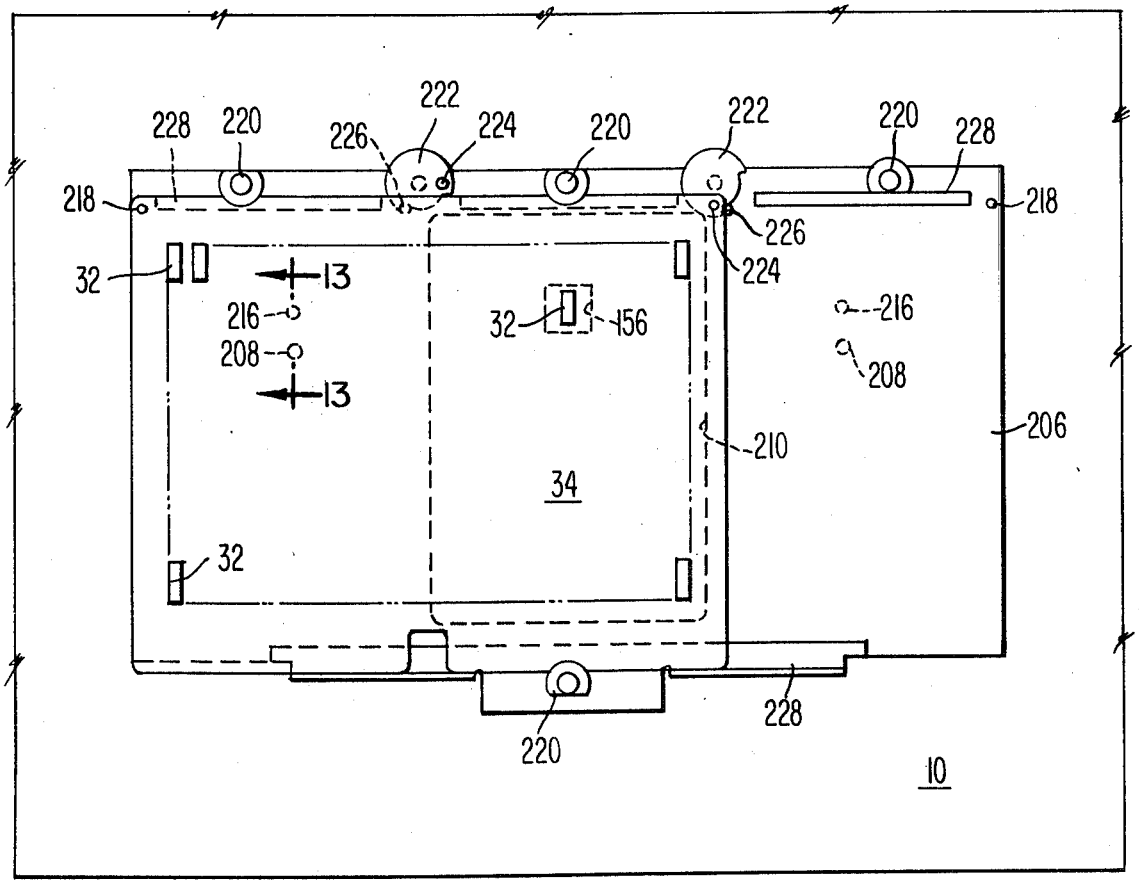
FIG. 10 is a top plan view on a reduced scale of the printed circuit board holder or frame.
Figure 11:
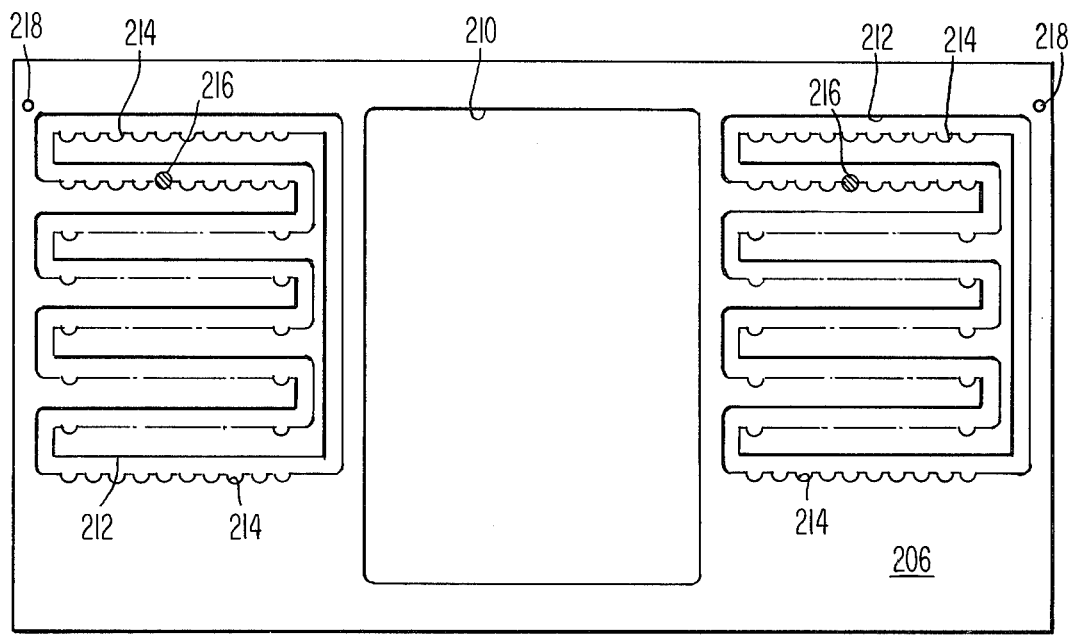
FIG. 11 is a bottom view of the template for the printed circuit board holder.
Figure 12:
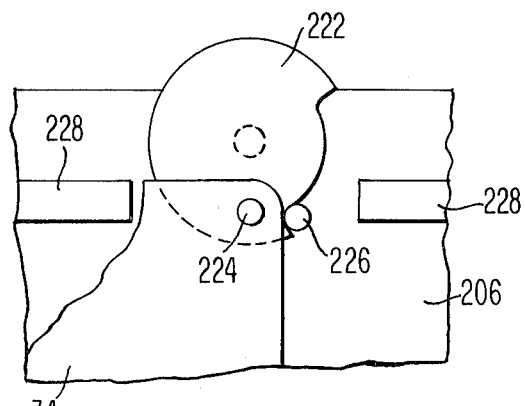
FIG. 12 is an enlarged view of the aligning mechanism for the printed circuit board.
Figure 13:
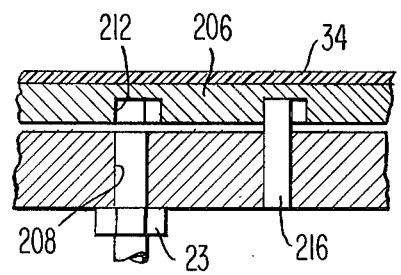
FIG. 13 is a sectional view along the line 13—13 of FIG. 10.

In order to permit the operator to move the printed circuit board 34 quickly and easily back and forth and side to side so as to orient the board with respect to the solid state chip, the printed circuit board is mounted on a movable, indexable frame 206, FIG. 10, which is supported on an air bearing provided by compressed air (from a source not shown) which is forced into and through the two oppositely disposed apertures 208—208 in bed plate 10. Frame 206 is a rectilinear structure of rigid material such for example as aluminum, having a large central cut-out 210 therein dividing the frame into two separate side portions of equal dimensions. The underneath surface of frame 206 is configured as by milling or machining wwith a series of interconnected grooves 212, FIG. 11, and half circular areas 214 and is receivable over vertically projecting oppositely disposed guide pins 216—216 in the base plate 10. Located at opposite right and left corners of frame 206 are two mounting pins 218—218 for correctly orienting the printed circuit board 34 thereon. THe forward edge of the frame 206 (top, as viewed in FIG. 10) is provided with three rotatable half circular tie down members 220. The rearward edge (bottom, as viewed in FIG. 10) carries a single rotatable tie down member 220 located centrally of the frame as seen in FIG. 10. An individual movable circular circuit board orienting member 222 is located between the left-most tie down member 220 and the central tie down member 220 and carries a vertically projecting pin 224 thereon. A second circular member carrying a vertically projecting pin 224 is located between the right most tie down member 220 and the central member 220 as viewed in FIG. 10, and is utilized to provide a guide pin for the upper right hand corner of the printed circuit board when the board is located in the left most position on the frame 206. When the frame is located to the right of the guide frame 206 then the left circular member is rotated against its stop 226 to bring its associated pin 224 into the hole in the upper left corner of the printed circuit board while the upper right corner hole is received over pin 218 in the upper right corner of the frame 206. This arrangement of pins and tie down members permits the employment of relatively large size printed circuit boards and enables the operator to shift from one side of the board to the other so as to position the solid state chips in rows and columns on the board as seen most clearly in FIG. 10. Elongated pads or supports 228 are located adjacent the perimeter of the frame inboard of the tie down memers 220 and act as spacer members to prevent the connector pins of the chips from being bent or damaged by accidental contact with the flat surface of the frame when the chips are completely mounted on one side thereof.

OPERATION OF THE CHIP INSERTER APPARATUS

The operator first switches "ON-OFF" toggle switch 234 to the on position which energizes single action long stroke air cylinder 236 raising the insertion head 16, feed mechanism 18 and chip magazine 19 to the position shown in FIG. 1 providing clearance for hand loading of the printed circuit (PC) board. Air cylinder 22 (FIG. 1) is similar to cylinder 236 but slightly modified to cause it to act through a shorter stroke. With the apparatus in this position, angled slightly away from the horizontal and with the chip supply carrier channel filled with solid state chips or chip sockets 32, the operator places a printed wiring circuit board 34 on the template frame 206 and orients the opposite alignment holes of the PC board with the left and right hand frame pins 218 and 224. It is noted that the right hand pin 224 is part of rotatable PC board orienting member 222. The two members 222 permitting the apparatus to be adapted for left and right orientation of the PC board as hereinbefore set forth.

The PC board 34 (FIG. 10) is then locked in place on the frame 20 by rotating members 220 and 222. Members 220 overlie the frame while members 222 position the frame by means of the upstanding pins 224 and 226. The PC board is now movable on the air bearing developed by compressed air forced through holes 208 in the base 10 effective to position the frame beneath the inserter head over the opening 156. The operator now orients the desired row and column of printed circuit board holes with the head. Frame 206 is now located with the guide pins 216, which are secured in and project from the base 10, in selected circular areas 214 on the underside of the template frame 206 with the rows and columns of perforated holes in the printed circuit board in position to receive the chip.

Switch 234 is now switched to the "OFF" position which cuts off air to cylinder 236 also cutting off air providing the air bearing. As seen in FIG. 1, the leftwardly projecting portion of vertical L-shaped linkage 230 includes a horizontal bar 238 extending from side to side of the machine so as to ride or float on the top of the two vertically disposed plungers of air cylinders 22 and 236. With air cut off to cylinder 236 and with cylinder 22 inactive the plungers area retracted into the cylinders permitting the weight of the insertion head and associated linkage to rock or pivot counterclockwise about pivot 240 (from the full to the dotted line position, FIG. 1).

At this point, air cylinder 20 is in the full retracted position as seen in FIG. 1 with the L-shaped lever arm 100 in the dotted line position holding switch 28 closed. Members 12 and 14 are in the lowermost or home position, FIGS. 1 and 2. Also, as shown in FIG. 4, and as described hereinbefore, a (D-I-P) socket 32 has slipped by gravity between the chip engaging blades 38 and 39 of member 66 in preparation for arcuate movement into insertion position as will be described.

As seen in FIG. 1, switch controls 24 include two foot pedal switch members FPSI and FPSII which, as will be described, control the movement of the insertion head and the crimping mechanism. The operator now depresses FPSI applying air to short stroke cylinder 22, rocking linkage 230-238 clockwise raising insertion head 16. The insertion head 16 is now sufficiently distant to clear any components of the PC board. Through closed switch 28 air now goes beneath the template raising and floating the template. Between subsequent insertion operations the board now is manually guided to new insertion positions. Release of FSI permits the head mechanism to lower of its own weight toward the PC board with the template now in place for the socket insertion operation.

Foot switch FSII is actuated causing the first stage of the two stage ram 168 to be activated. FIGS. 2, 5, and 6 through 8 inclusive. Rods or shoulder bolts 173 are screwed into block 172 and are free to slide in part 169. Springs 174 surround rods 173. Slight tension holds members 172 and 169 apart. When the first stage of compound cylinder 168 (FIG. 1) is activated piston rod or plunger 166 travels upwardly pushing block 172, block 196, actuator 202, rods 173—173 causing springs 174 to resiliently raise member 169.

Figure 7:
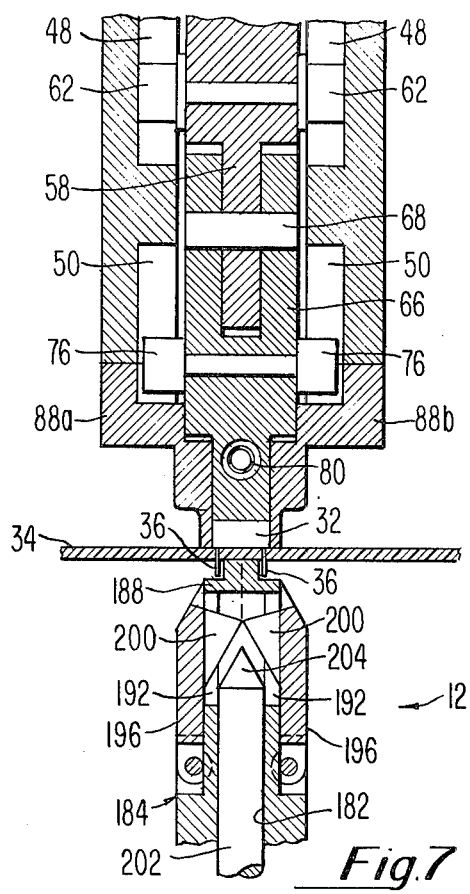
FIG. 7 is a sectional view along the line 7—7 of FIG. 5.
Figure 8:
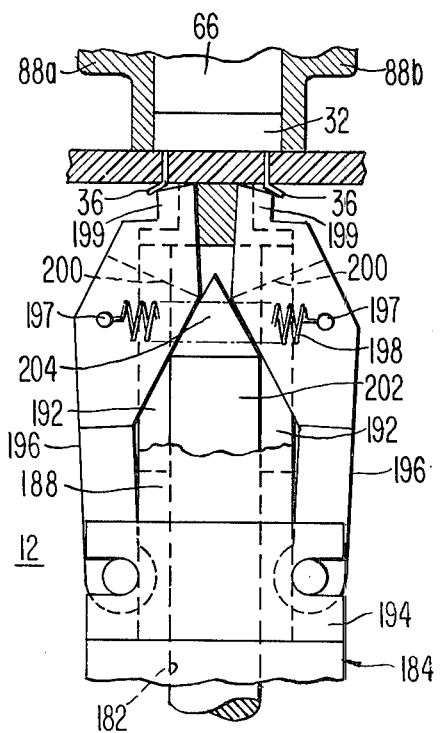
FIG. 8 is an enlarged detail view partly in section illustrating the movement of the pin clincher spreader members for the chip insertion head of the present invention.
Figure 9:
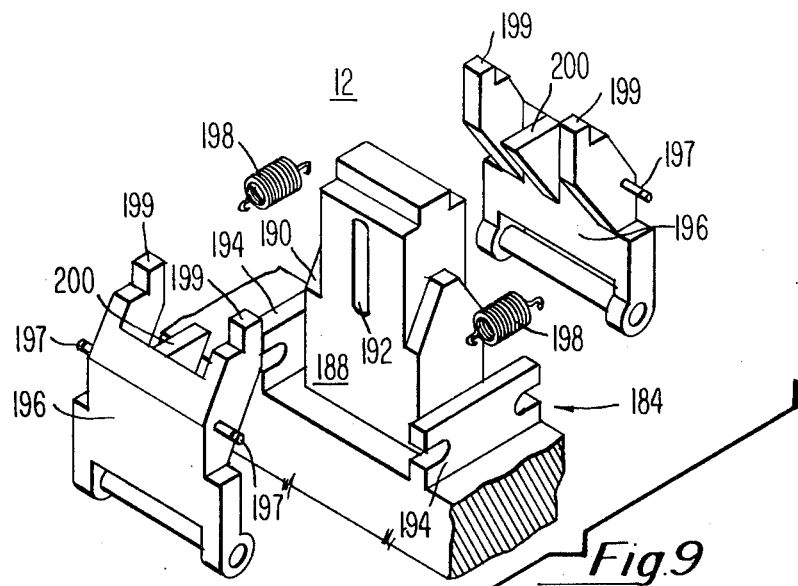
FIG. 9 is an isometric view of the clinching spreaded mechanism of the invention.

The amount of travel of the first stage of cylinder 168 is sufficient to raise member 169 to contact with and press against the dampening washers 167—167 on the underside of member 160 pressing the upper surface of the anvil mechanism 12 into contact against the bottom of the printed circuit board 34 with the jaws 196 of the clinching mechanism disposed between the two rows of pins 36 of the chip as seen in FIGS. 6 through 8 inclusive.

As member 169 moves vertically upwardly cam 180 carried thereby strikes actuator 198 closing switch 26 which applies air pressure to cylinder 20 driving it forward (leftwardly, FIGS. 1, 2 and 3).

As ram 20 drives link 154 and L-shaped link 100 leftwardly, surface 106, FIG. 4, of pushrod 98 contacts surface 107 of slide mechanism 40 pushing mechanism 40 downwardly. Continued downward movement of link 98 swings member 66 counterclockwise about pivot 68, FIG. 2, closing jaws 38 and 39 about socket 32 forcing the pins 36 of the socket into and through the holes of the printed circuit board 34 as seen most clearly in FIG. 5.

At the end of the leftward movement of ram 20 and link 100 (the left dotted line position in FIG. 1) switch 30 is cammed closed, energizing the second stage of the two stage ram 168.

Figure 14:
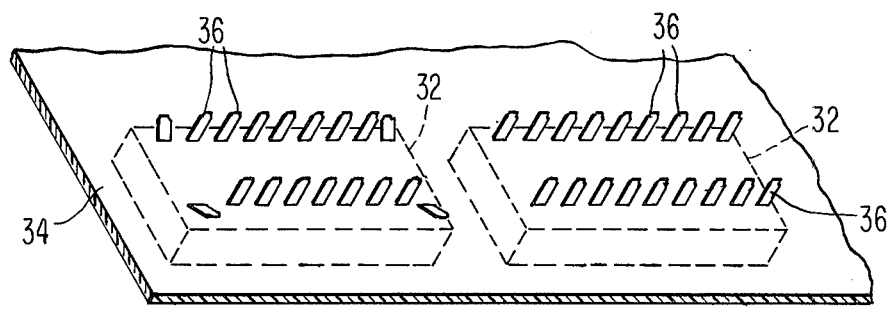
FIG. 14 is an enlarged bottom view of a portion of the printed circuit board and an associated clinched chip.

The second stage of compound cylinder ram 168 causes piston rod 166 to move further upwardly pushing blocks 172 and 176 vertically up raising actuator rod 202 from the position of FIG. 6 to the position of FIG. 8. Since block 169 is against the stop formed by the washers 167—167 and the member 160 this second vertical movement causes springs 174—174 to compress. The conical surface 204 rides upwardly against the confronting surfaces of members 200—200 forcing the jaws apart, FIG. 8, causing the clinching elements 199—199 to bend the four outer corner pins of socket 32 slightly angularly outwardly against the bottom of the board 34, FIG. 14. The pistons inside the compound cylinder or ram 168 stop at the end of the stroke. FSII is now released returning the compound air cylinder 168 to retracted or start position and the cycle of operation is ended.

The operator closes FSI which applies air to short stroke cylinder 22 rocking linkage 230-238 raising insertion head 16 and causing air cylinder 20 to retract and return linkage 100 to the dotted line position of FIG. 1. This causes retracting movement of the elevating mechanism which raises link 98 causing member 66 to pivot counterclockwise about its pivot 68 whereby movable jaw 38 abuts pin 82 swing the jaw 38 open as in FIG. 4. Concurrently, cam 104 in its upward movement pushes A-frame 134 clockwise forcing pin 140 into the recess in new socket 32 while pin 146 is pushed out of interference. When switch 28 is closed by plunger 154, air goes beneath the template raising and floating the template. The template and frame 206 carrying the PC board 34 is indexed manually from left to right one step for each cycle of operation until the first row is populated with chips. The frame is then moved "forward" to the next row and then right and left until the second row is populated and so on until the PC board is completely filled with chips.

The track or grooved area is machined so as to guide the operator back to the start position when the board is completely filled. The indexing and return to start is performed while FSI is closed, then operator closes toggle switch 234 raising the insertion head and moves the populated board and positions an empty board.

What is claimed is:

1. Solid state chip insertion apparatus comprising:
   chip insertion means including means arcuately movable from a chip receiving position to a chip insertion position for inserting a solid state chip into a printed circuit board;
   means for individually releasing said chips from a supply so as to move by gravity to said insertion means;
   means mounting a printed circuit board for adjustable positioning movement adjacent to said chip insertion means;
   detent template means carried by said printed circuit board mounting means for guiding said board to a predetermined chip location in rows and columns without visual alignment of said board and said chip;
   operator controlled means operably associated with said chip insertion means for actuating said insertion means effective to insert a chip into said printed circuit board; and
   clinching means for deforming the contacts of said chips to retain the chips within said printed circuit board so as to prevent accidental dislodgement therefrom after insertion of the chips into and through the board prior to soldering.

2. The invention in accordance with claim 1 wherein said chip releasing means includes rockable means engaging said chips and movable out of engagement with said chip, whereby said chip may move by gravity to said insertion means.

3. The invention in accordance with claim 1 wherein said chip insertion means includes carrier means into which a chip is moved by gravity from said releasing means for guiding said chip into a position from which the chip is inserted into said printed circuit board.

4. The invention in accordance with claim 1 wherein said printed circuit board mounting means includes adjustable means disposed along the edge of said mounting means for orienting opposite sides of said board relative to said clinching means enabling said detent template means to engage said printed circuit board mounting means at a selected location so that the chips may be introduced onto said board in rows and columns according to a predetermined arrangement.

5. The invention in accordance with claim 1 wherein said apparatus includes oppositely disposed pin members selectively receivable in ordered rows and columns of interconnected grooves in the lower surface of said template whereby said template means may be moved to individual row and column positions to successively precisely orient said printed circuit board relative to said chip insertion means.

6. The invention in accordance with claim 1 wherein said clinching means comprises a two-stage mechanism including an anvil for said chip insertion means movable into contact with said printed circuit board and further including means receivable between the connector pins of said chip to deflect selected connector pins effective to retain said chip within said board prior to soldering.

7. The invention in accordance with claim 1 wherein said chip clinching means further comprises a two-stage drive means for positioning a supporting anvil in contact with said printed circuit board, and hydraulic ram means operably associated with said anvil drive ram means for moving said insertion means away from said printed circuit board and whereby said insertion means may move by gravity towards said printed circuit board.

8. The invention in accordance with claim 1 further including switch means associated with said chip inserting means and said clinching means effective to control the energization and release of said insertion means and clinching means effective to insert and clinch a chip onto said printed circuit board.

9. The invention in accordance with claim 1 wherein said clinching means further comprises a reciprocable plunger, a pair of confronting rockably movable jaw members biased into confronting contact and including means operably engageable with said reciprocable plunger whereby movement of said plunger against said means opens said jaw members effective to angularly bend connector leads of said chip relative to said printed circuit board thereby to retain said chip on said board for soldering.

10. The invention in accordance with claim 1 further including hydraulic ram means for pivotally moving said chip inserting means relative to said clinching means whereby the circuit board mounting means may be inserted and removed.

* * * * *